(12) United States Patent
Rehwald

(10) Patent No.: US 10,241,171 B2
(45) Date of Patent: Mar. 26, 2019

(54) FAT SUPPRESSION BY COMBINING FAT SATURATION WITH FAT INVERSION

(71) Applicant: Siemens Healthcare GmbH, Erlangen (DE)

(72) Inventor: Wolfgang G. Rehwald, Chapel Hill, NC (US)

(73) Assignee: Siemens Healthcare GmbH, Erlangen (DE)

( * ) Notice: Subject to any disclaimer, the term of this patent is extended or adjusted under 35 U.S.C. 154(b) by 210 days.

(21) Appl. No.: 15/452,864

(22) Filed: Mar. 8, 2017

(65) Prior Publication Data

US 2018/0259606 A1    Sep. 13, 2018

(51) Int. Cl.
*G01R 33/48* (2006.01)
*G01R 33/50* (2006.01)

(52) U.S. Cl.
CPC ..... *G01R 33/4828* (2013.01); *G01R 33/4818* (2013.01); *G01R 33/50* (2013.01)

(58) Field of Classification Search
CPC . G01R 33/4828; G01R 33/4818; G01R 33/50
See application file for complete search history.

(56) References Cited

U.S. PATENT DOCUMENTS

| | | | |
|---|---|---|---|
| 5,909,119 A | 6/1999 | Zhang et al. | |
| 7,148,685 B2 | 12/2006 | Block et al. | |
| 8,427,147 B2 | 4/2013 | Block et al. | |
| 8,446,148 B2 * | 5/2013 | Rehwald | G01R 33/4818 324/309 |
| 9,256,977 B2 | 2/2016 | Rehwald et al. | |
| 2015/0077106 A1 | 3/2015 | Kim et al. | |

OTHER PUBLICATIONS

Haase, A et.al.: "1H NMR Chemical Shift Selective (CHESS) Imaging", in: Phys Med Biol, 1985, vol. 30, No. 4, pp. 341-344.
Kaldoudi, et.al.: "A Chemical Shift Selective Inversion Recovery Sequence for Fat-Suppressed MRI: Theory and Experimental Validation", in: Magnetic Resonance Imaging, vol. 11, pp. 341-355, 1993.
Lauenstein, Thomas C., et al. "Evaluation of optimized inversion-recovery fat-suppression techniques for T2-weighted abdominal MR imaging." Journal of Magnetic Resonance Imaging 27.6 (2008): 1448-1454.

(Continued)

*Primary Examiner* — G. M. A Hyder

(57) ABSTRACT

A method of fat suppression during magnetic resonance imaging includes applying a fat suppression module to a region of interest within a subject. The fat suppression module comprises a fat-selective saturation pulse; a first spoiler gradient applied following the fat-selective saturation pulse; a fat-selective inversion pulse applied to the region of interest following a time delay; and a second spoiler gradient applied following the fat-selective inversion pulse. The time delay is selected to allow T1 recovery in the region of interest to a predetermined level of fat magnetization at the end of the time delay. Following application of the fat suppression module, a sequence readout is performed to acquire one or more lines of k-space data covering the region of interest.

20 Claims, 10 Drawing Sheets

(56) References Cited

OTHER PUBLICATIONS

Niitsu, Mamoru, Eriko Tohno, and Yuji Itai. "Fat suppression strategies in enhanced MR imaging of the breast: comparison of SPIR and water excitation sequences." Journal of Magnetic Resonance Imaging 18.3 (2003): 310-314.
Zuehlsdorff, S., et al. "Fat suppressed delayed enhancement imaging." Proceedings of the 14th Annual meeting of ISMRM, Seattle, Washington, USA. 2006.
Bley, Thorsten A., et al. "Fat and water magnetic resonance imaging." Journal of Magnetic Resonance Imaging 31.1 (2010): 4-18.
Lim, Ji Kyung, and Woo Mok Byun. "Three-Dimension Magnetic Resonance Lumbosacral Radiculography by Principles of the Selective Excitation Technique Imaging in the Diagnosis of Symptomatic Foraminal Stenosis." Journal of the Korean Society of Radiology 66.6 (2012): 551-558.
Scheffler, Klaus, Oliver Heid, and Jürgen Hennig. "Magnetization preparation during the steady state: Fat-saturated 3D TrueFISP." Magnetic resonance in medicine 45.6 (2001): 1075-1080.
Meyer, Craig H., et al. "Simultaneous spatial and spectral selective excitation." Magnetic Resonance in Medicine 15.2 (1990): 287-304.
Sklenář, Vladimír, and Zenon Starčuk. "1-2-1 pulse train: a new effective method of selective excitation for proton NMR in water." Journal of Magnetic Resonance (1969) 50.3 (1982): 495-501.
Thomasson, David, David Purdy, and J. Paul Finn. "Phase-Modulated binomial RF pulses for fast spectrally-selective musculoskeletal imaging." Magnetic resonance in medicine 35.4 (1996): 563-568.
Dixon, W. Thomas. "Simple proton spectroscopic imaging." Radiology 153.1 (1984): 189-194.
Glover, G. H., and E. Schneider. "Three-point dixon technique for true water/fat decomposition with B0 inhomogeneity correction." Magnetic resonance in medicine 18.2 (1991): 371-383.

* cited by examiner

FAT SUPPRESSION BY COMBINING FAT SATURATION WITH FAT INVERSION

TECHNOLOGY FIELD

The present invention relates generally to methods, systems, and apparatuses for improving fat suppression in Magnetic Resonance Imaging (MRI) by combining fat saturation with fat inversion. The disclosed techniques may be applied to enhance differentiation of fat from fluids and other portions of an acquired image to facilitate better diagnostic accuracy in clinical applications.

BACKGROUND

Fat suppression manipulates the magnetization of fat so that it has no signal (approximately) at the time of the acquisition (readout). Thereby, a fat-suppressed gray-scale MR image depicts fat as black allowing for better differentiation of fat from, for example, fluids which are depicted as bright. Two fat suppression methods currently exist, fat saturation and fat inversion.

A saturation pulse has the advantage that the magnetization after the pulse is not dependent on that before the pulse, because it destroys it completely. In other words, it creates a "clean slate" for magnetization and makes it independent of the magnetization history. Thus, it has the major advantage that it creates an immediate and consistent steady state after the pulse. It has the disadvantage that it provides less separation between species of different T1 values and therefore creates less T1 contrast than inversion pulses. Also, it cannot create negative magnetization. Magnetization after an inversion pulse depends on the magnetization before the pulse. Therefore, if playing a series of inversion pulses and if a T1 species is not given enough time to fully recover to equilibrium magnetization ($TR_{eff} < 5*T1$ of the species), then magnetization after each pulse is different initially. Only when the magnetization undergoes the same recovery curve between every pair of consecutive IR pulses will the magnetization be identical after each IR pulse. This is known as steady state and requires time (a certain number of $TR_{eff}$ periods) until it is established. If data is acquired before steady state is reached, inconsistent T1 contrast or ghosting results. The advantage of an inversion is that it can create negative magnetization. In the context of fat suppression, this property of an inversion allows creating zero fat magnetization at a time further away from the preparation than for fat saturation. Also, slightly negative fat magnetization can be created which can improve fat suppression in the presence of B0- and B1-inhomogeneity.

Fat saturation applies a 90° radio frequency pulse at the fat frequency and spoils the created transverse fat magnetization so that longitudinal and transverse fat magnetization are zero at the beginning of the readout. This module is played immediately before the data readout and is known as CHEmical Shift Selective (CHESS) method. Because fat T1 is short, fat magnetization recovers quickly after the application of the fat saturation.

One major disadvantage of fat saturation is that it is B1-sensitive because the RF pulse that it uses is typically not adiabatic. Therefore the actually applied flip angle varies by B1 and thus by location. The actual flip angle does not exactly equal the prescribed ideal flip angle of 90° at any given location in the image. More importantly, fat saturation is B0-sensitive, because the RF pulse is frequency selective. In practice, the static magnetic field B0 varies by location changing the local fat and water resonance frequencies. Thus, the RF pulse is not applied exactly on the fat frequency at any given location and has locally varying efficiency. This modulates the actually applied flip angle in addition to the B1 effects described above. As a result, fat magnetization is typically not homogeneously suppressed by fat saturation.

Additionally, fat saturation erases the fat magnetization at the beginning of the readout. Whereas this is the optimal point in time for turbo-spin echo readouts, it is not optimal for gradient echo and steady state free precession (SSFP) readouts with linear reordering. For the fat to be suppressed in these latter sequences, the fat magnetization must be zero when acquiring the contrast relevant portion of the raw data, which is typically at the center of the readout. As fat recovers rapidly and starts with zero magnetization at the beginning of the readout, it has typically recovered significantly at the readout center so that it is not dark enough in the image.

Fat-selective inversion typically uses a spectrally attenuated inversion recovery (SPAIR) adiabatic pulse that is followed by a spoiling gradient and a time delay. After the application of the SPAIR pulse fat undergoes T1-recovery. The time delay is calculated so that the fat magnetization is nulled (crosses the zero-signal line) or is slightly negative during data readout following the time delay. This typically results in lower fat signal and hence a better fat suppression than by fat saturation. Also, the method is B1-robust, because the SPAIR pulse is adiabatic.

However, like fat saturation, fat inversion has a disadvantage, its frequency-selectivity which makes the fat inversion efficiency B0-dependent. As consequence, the fat recovery starting point is B0-dependent and varies locally. Inhomogeneous fat suppression is the consequence. This can be partially mitigated by setting the time delay to such value that fat magnetization is close enough to zero everywhere, slightly positive at some locations and slightly negative at others. This inhomogeneity is exacerbated if $TR_{eff}$ of the module is too short for a full fat recovery between SPAIR pulses. Now, the steady state also locally varies and it is even more difficult to find the time delay where all locations have about zero magnetization at the contrast relevant portion of the raw data.

Even more critical, a major problem of fat inversion in this case ($TR_{eff}$ of the module is too short for a full fat recovery between SPAIR pulses) is that it takes multiple $TR_{eff}$ until steady state and thus consistent fat suppression is established. Often the leading non-steady state magnetization is acquired causing for example poor fat suppression for the slices acquired with the initial echo trains. This phenomenon can be appreciated in FIG. 1. In this example fat magnetization is fully recovered (at M0) before application for the first fat-selective inversion (FSIR) pulse. It takes the fat magnetization until the fourth turbo spin echo (TSE) train to reach steady state (where 'steady state' means that fat magnetization undergoes the identical recovery curve in periodic manner).

In FIG. 1 only the recovery curves after the last two FSIR pulses are at steady state. Therefore fat is depicted with a different gray-level for each of the TSE trains except for the last two, where fat magnetization is depicted identically and black. A solution to this problem was designed as shown in FIG. 2. A so-called "tickle pulse" was introduced before the first FSIR pulse so that the magnetization before this first FSIR is the same as before all other FSIR pulses. In theory, this solves the problem illustrated in FIG. 1 because fat is perfectly nulled (black) immediately, including the first readout. In practice, however, fat suppression for the leading slices is improved, but the problem is not completely solved because the "tickle pulse" is not adiabatic and therefore has a B1-dependent flip angle. Therefore, the optimal flip angle is not applied everywhere and consequently fat suppression is not optimal in the leading TSE trains.

SUMMARY

Embodiments of the present invention address and overcome one or more of the above shortcomings and drawbacks, by providing methods, systems, and apparatuses related to improving fat suppression in MRI by combining fat saturation with fat inversion with a particular pulse sequence referred to herein as a "fat suppression module." One aspect of the fat suppression module is that it solves the problem of the locally varying fat steady state. Another aspect is that it solves the problem of initial lack of steady state for the repeated and periodical application of SPAIR pulses. The problem occurs in the specific case where fat does not fully recover during the effective TR ($TR_{eff} < 5*T1$ of fat), for example, in multi-slice TSE imaging. Multi-slice TSE acquires a series of echo trains consecutively after one initial trigger (respiratory trigger in case of Prospective Acquisition CorrEction, or "PACE," navigation) and plays a fat suppression before each echo train, wherein each train belongs to a different slice within a slice group. Different degrees of fat suppression are observed within each slice (different local steady states) and across the slices, as earlier slices are not at steady state and therefore have different fat suppression than later slices.

The fat suppression module described herein preserves the positive aspects of fat inversion by SPAIR, which is its B1-insensitivity due to the adiabatic nature of the SPAIR pulse, and its fat nulling capability due to its inversion property. The module overcomes the problem of locally varying steady state by applying a fat saturation first to erase all fat magnetization, then a time delay to let fat magnetization partially recover to a controllable value, and then a SPAIR pulse to invert the fat magnetization. This order of events establishes fat magnetization that no longer depends on its value prior to the module (no history dependence), yet it allows for partial fat inversion for controlled and precise fat nulling during the data readout. In other words, the fat suppression module has the advantage offered by an inversion (complete fat nulling) without the disadvantage of relying on its prior magnetization.

Another aspect of the fat suppression module is that it reduces the problem of fat suppression dependence on B0- and B1-homogeneity. The combination of saturation and inversion provides a partial self-compensation of imperfect flip angles that result from both B1 and B0 imperfections. For example, if the actual flip angle is smaller than the intended angle (70° instead of 90°) then the module's leading saturation pulse will not fully erase the fat magnetization so that it recovers to a larger value during the ensuing time delay than in the ideal case. Advantageously, the following inversion is also less efficient at the same locations where fat magnetization is now larger, so that after the SPAIR inversion magnetization is homogeneously conditioned despite varying flip angles across the treated slice.

According to some embodiments of the present invention, a method of fat suppression during magnetic resonance imaging includes applying a fat suppression module to a region of interest within a subject. The fat suppression module comprises a fat-selective saturation pulse; a first spoiler gradient applied following the fat-selective saturation pulse; a fat-selective inversion pulse applied to the region of interest following a time delay; and a second spoiler gradient applied following the fat-selective inversion pulse. The time delay is selected to allow T1 recovery in the region of interest to a predetermined level of fat magnetization at the end of the time delay. Following application of the fat suppression module, a sequence readout is performed to acquire one or more lines of k-space data covering the region of interest. This the sequence readout may include, for example, a turbo-spin echo readout train. In this case, the time delay is selected such that fat magnetization in the region of interest is substantially zero at the beginning of the turbo-spin echo readout train.

Various enhancements, refinements, and other modifications can be made to the aforementioned method in different embodiments. For example, the fat-selective inversion pulse or the fat-selective saturation pulse may be an adiabatic pulse. In some embodiments, the time delay used by the module is selected such that fat magnetization is a predetermined value (e.g., zero) when the sequence readout acquires a contrast-relevant portion of k-space. The amplitude and sign of the first spoiler gradient or the second spoiler gradient may be determined, for example, by a random or pseudo-random scheme.

In one specific implementation of the fat suppression module, the leading single fat saturation pulse is replaced by a series of fat saturation pulses played at different frequencies around the fat frequency. For example three pulses are played at the fat frequency, and with a +50 Hz and −50 Hz offset. This increases the B0 robustness compared to a single fat saturation pulse as a wider frequency range is covered.

According to other embodiments of the present invention, a second method of fat suppression during magnetic resonance imaging includes applying a fat suppression module to a region of interest within a subject. The fat suppression module comprises a series of fat-selective saturation pulses, a time delay starting and the end of the series of fat-selective saturation pulses, a fat-selective inversion pulse applied to the region of interest following the time delay; and a second spoiler gradient applied following the fat-selective inversion pulse. The first spoiler gradient is applied to the region of interest following each fat-selective saturation pulse. The aforementioned time delay is selected to allow T1 recovery in the region of interest to a predetermined level of fat magnetization at the end of the time delay. Following application of the fat suppression module, one or more lines of k-space data covering the region of interest are acquired.

In some embodiments of the aforementioned second method, the series of fat-selective saturation pulses is applied at different frequencies within 100 Hz of a fat frequency. In some embodiments, each fat-selective saturation pulse has a different flip angle between 90° and 180°. In some embodiments, each fat-selective saturation pulse is rotated around a different axis.

In some embodiments, a system for fat suppression during magnetic resonance imaging includes an imaging device comprising a plurality of coils; one or more processors; and a non-transitory, computer-readable storage medium in operable communication with the processor. The computer-readable storage medium contains one or more programming instructions that, when executed, cause the processors to perform one or more of the methods discussed above.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific instrumentalities disclosed. Included in the drawings are the following Figures.

DETAILED DESCRIPTION

The following disclosure describes the present invention according to several embodiments directed at methods, systems, and apparatuses related to improving fat suppression in MRI by combining fat saturation with fat inversion. More specifically, the techniques discussed herein apply a particular pulse sequence, referred to herein as a "fat suppression module," that has the same advantage as conventional fat inversion, which is the darker fat depiction (complete fat nulling) than by fat saturation, without the disadvantage of fat inversion, which is its dependence on the fat magnetization history. Moreover, the fat suppression module provides an improvement over existing fat suppression methods in that it is less dependent on B1 and B0 homogeneity than existing techniques and provides darker fat than fat saturation. Furthermore, the fat suppression module discussed herein work equally for fully recovered as well as partially recovered fat magnetization, or more technically stated, the module suppresses fat regardless of the fat suppression module's effective repetition time ($TR_{eff}$). Unlike fat inversion techniques, the fat suppression module described herein does not need to be executed during so called leading "dummy TRs" to become effective; instead the module is equally effective every time it is applied.

Figure 1:
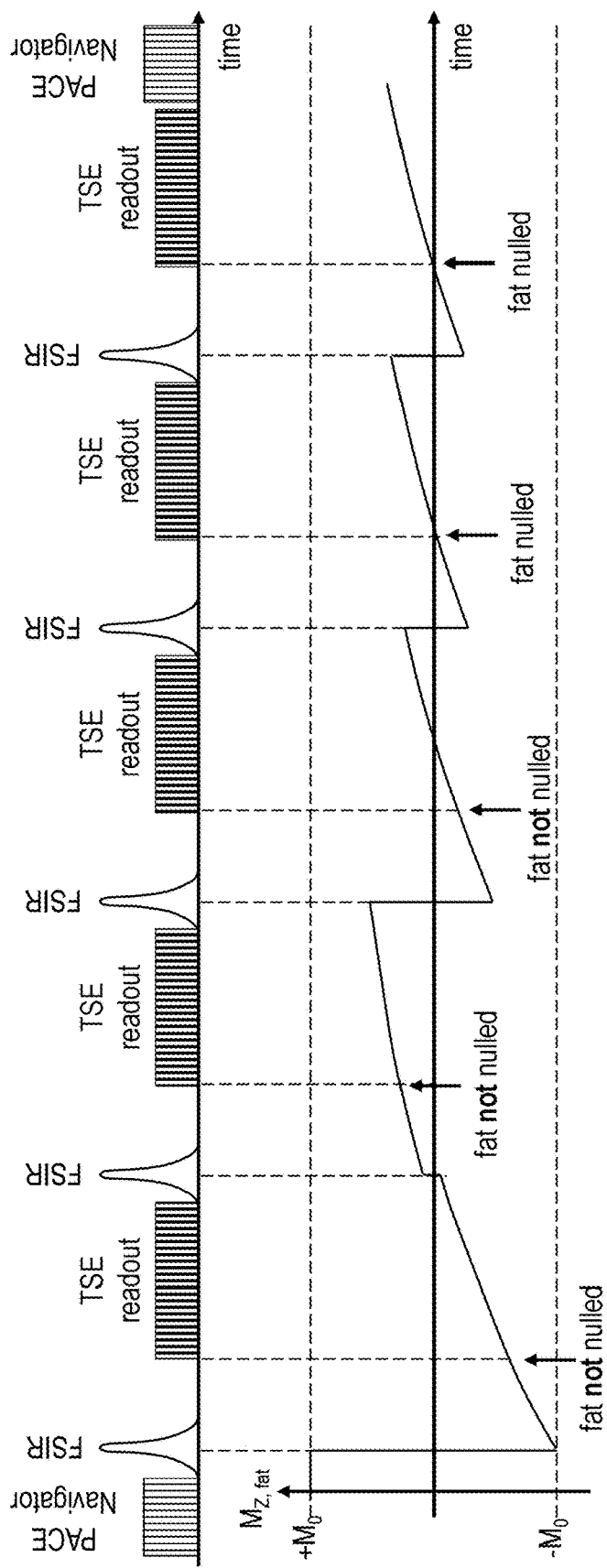
FIG. 1 illustrates a conventional technique for applying a series of fat-selective inversion pulses prior to each of five TSE readouts for acquiring five slices, between two respiratory navigator scans.
Figure 2:
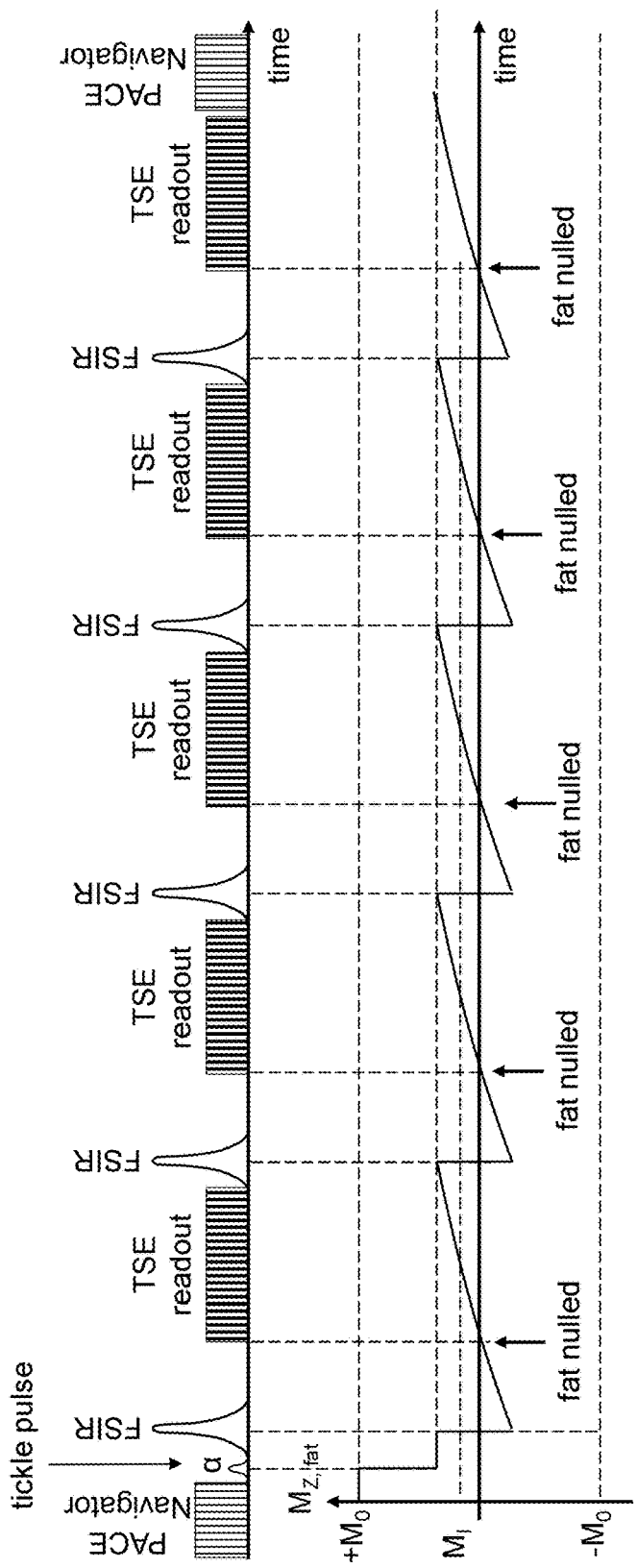
FIG. 2 shows a conventional technique for applying a series of fat-selective inversion pulses and a leading tickle pulse with TSE Readouts between two respiratory navigator scans.
Figure 3:
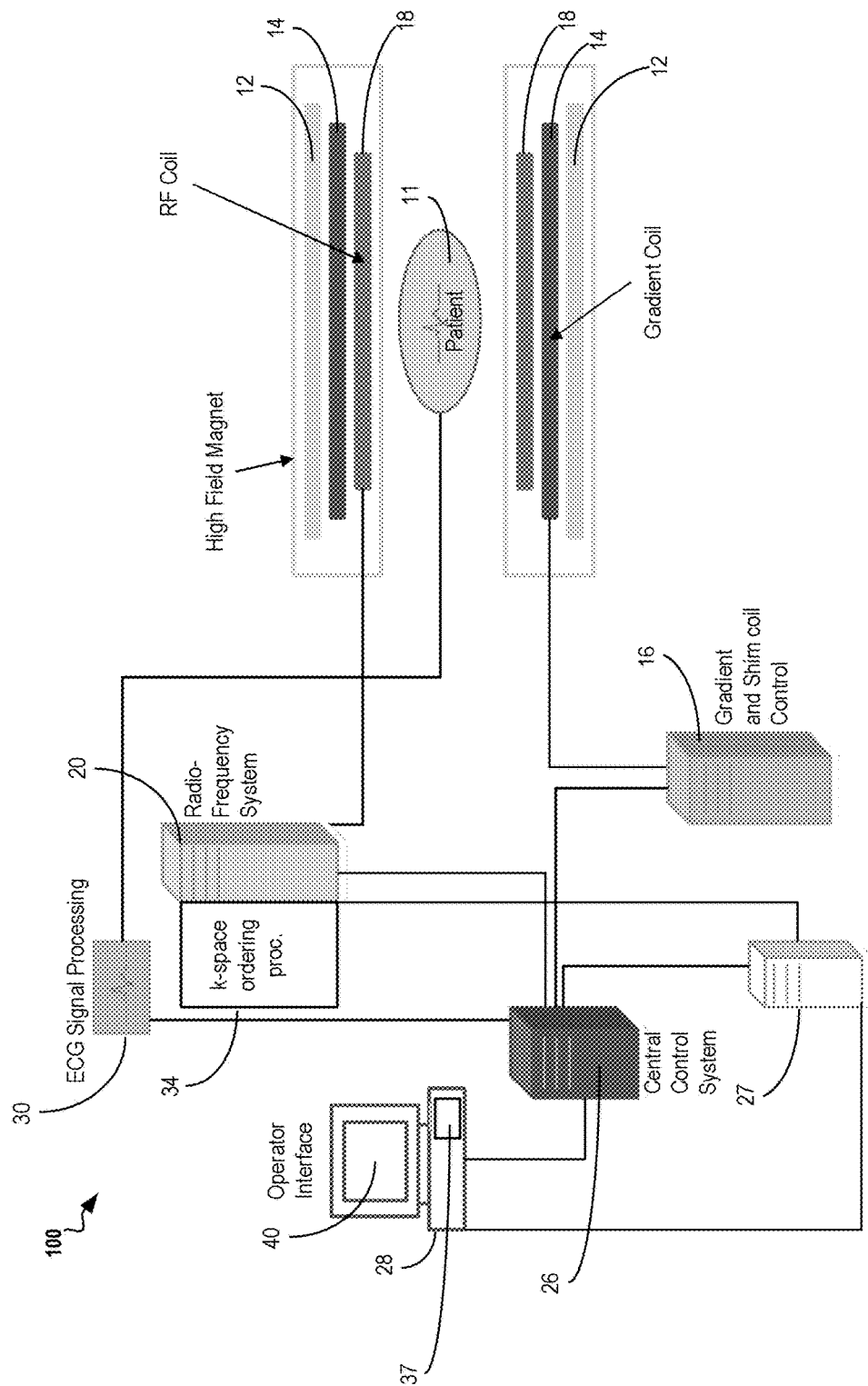
FIG. 3 shows a system for ordering acquisition of frequency domain components representing magnetic resonance image data for storage in a k-space storage array, as used by some embodiments of the present invention.

FIG. 3 shows a system 100 for ordering acquisition of frequency domain components representing MRI data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Further radio frequency (RF) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF module 20 and k-space component processor unit 34 to provide a magnetic resonance dataset to an image data processor for processing into an image. In some embodiments, the image data processor is located in central control unit 26. However, in other embodiments such as the one depicted in FIG. 3, the image data processor is located in a separate unit 27. Electrocardiogram (ECG) synchronization signal generator 30 provides ECG signals used for pulse sequence and imaging synchronization. A two or three dimensional k-space storage array of individual data elements in k-space component processor unit 34 stores corresponding individual frequency components comprising a magnetic resonance dataset. The k-space array of individual data elements has a designated center and individual data elements individually have a radius to the designated center.

A magnetic field generator (comprising coils 12, 14, and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components are sequentially acquired during acquisition of a magnetic resonance dataset representing a magnetic resonance image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components which is substantially minimized.

Central control unit 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 3, display processor 37 processes the magnetic resonance signals to reconstruct one or more images for presentation on display 40, for example. Various techniques may be used for reconstruction. For example, in conventional systems, an optimization algorithm is applied to iteratively solve a cost function which results in the reconstructed image.

According to various embodiments described herein, the system 100 illustrated in FIG. 3 is applied to improve fat suppression in MRI by combining fat saturation with fat inversion with a fat suppression module. The function of the fat suppression module is to manipulate the magnetization of fat so that it has zero magnetization at the part of the readout that captures the contrast-relevant portion of the raw data (k-space), while not affecting water magnetization. A further function of the fat suppression module is to give the sequence programmer and/or scanner operator control over the fat magnetization level at the aforementioned part of the readout; specifically allowing the level to be adjusted to zero, a slightly negative, or slightly positive level. This is feasible by setting the respective time delay included in the fat suppression module.

FIGS. 4-7 illustrate the fat suppression module, according to some embodiments of the present invention. As described in further detail below, the module can be implemented with a single pulse or a series of fat saturation pulses. These figures also describe the module applied in an example implementation with multi-slice TSE imaging and respiratory navigators. The fat suppression module may be applied independent of the effective TR $TR_{eff}$ of the sequence (and, thus, the repetition frequency of the module). No changes to the module's time delay or flip angles are needed for achieving consistent fat suppression for any given $TR_{eff}$. Additionally, the fat suppression module provides fat suppression with better B0- and B1-robustness than fat saturation or fat inversion alone. As for any fat suppression method, the ultimate goal is that fat appears black in the corresponding MR image. In non-fat suppressed images, the fat signal is extremely bright so that other bright matter such as tissues and fluids are often hard to see or are mistaken for fat and vice versa. Diagnostic accuracy is therefore improved by the fat suppression module's high quality fat suppression.

Figure 4:
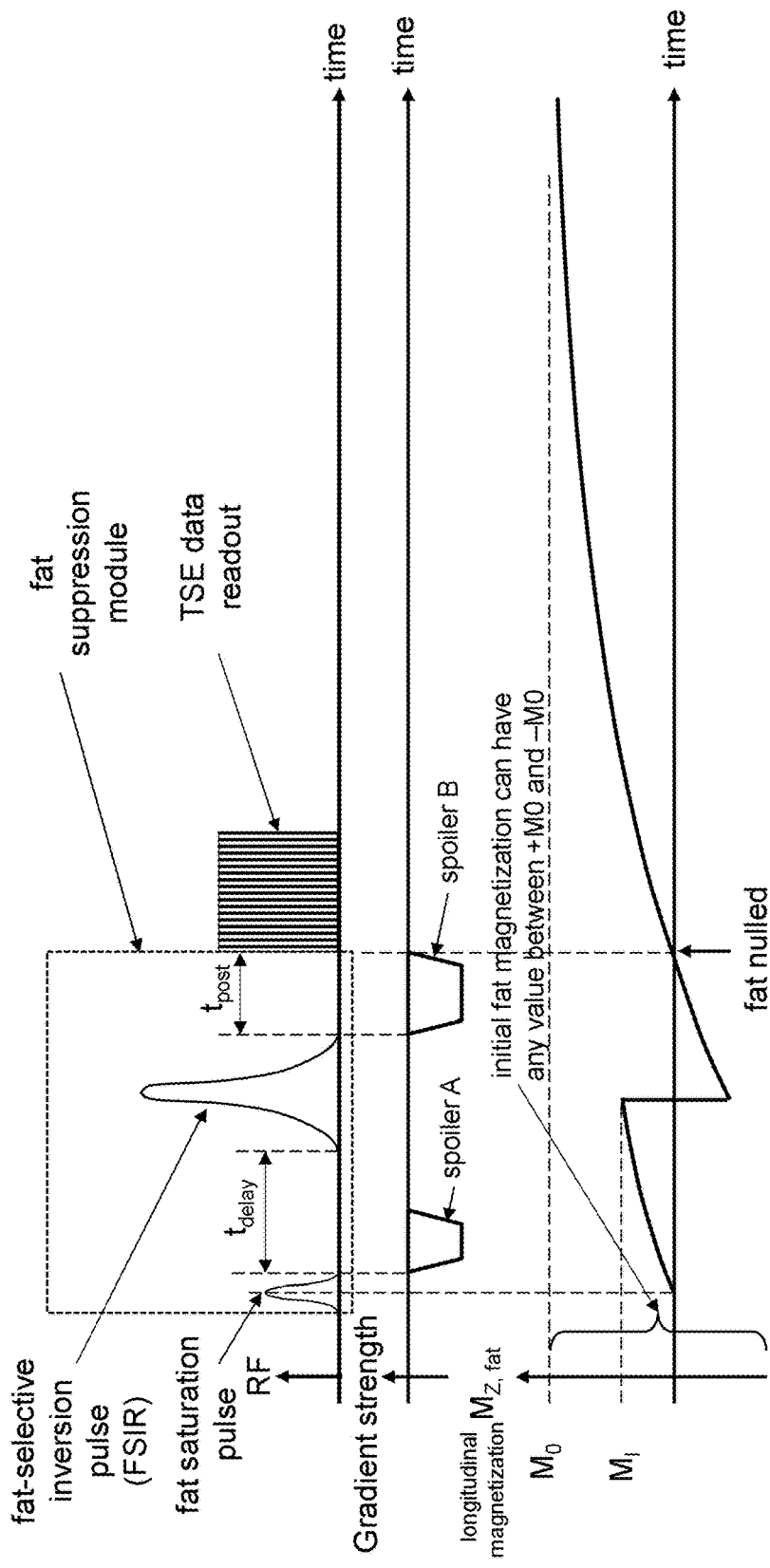
FIG. 4 shows a fat suppression module with consecutive Turbo-Spin Echo (TSE) readout, according to some embodiments of the present invention.

FIG. 4 shows an embodiment of the fat suppression module using a single fat saturation and a fat inversion by SPAIR. The leading fat saturation pulse erases all longitudinal and transverse magnetization. The RF pulse is a 90° pulse played on the fat resonance frequency. It brings all longitudinal magnetization into the transverse plane. A spoiler (labeled "spoiler A" in FIG. 4) is applied immediately after the pulse erasing all transverse magnetization. In some embodiments, the amplitude and sign of this spoiler is determined from a random or pseudo-random scheme. Such scheme provides "spoiler A" with a different area under the spoiler (realized by different amplitude, sign or length) every time the fat suppression module is executed. The purpose of such scheme is to avoid stimulated echoes of fat and resulting artifacts that may result from applying the same "spoiler A" gradient repeatedly and in periodic manner. One such pseudo random scheme could be playing relative areas +4, −1, 2, 5, −8, −6, 3, and then repeat the scheme.

Continuing with reference to FIG. 4, during the time delay $t_{delay}$, fat magnetization $M_{z,fat}$ recovers with T1 to level MI. The fat selective inversion inverts MI so that −MI is created, which again recovers with T1 during the remaining time $t_{post}$. The time $t_{post}$ is the duration of the second spoiler gradient (labeled "spoiler B" in FIG. 4). The area under "spoiler B" needs to be different than the area of "spoiler A", because using identical areas would create fat signal as spin echo rather than suppressing it. $t_{post}$ is not modified for a given module; rather $t_{delay}$ is adjusted to set the fat signal level as desired. In the example of FIG. 4, a time $t_{delay}$ was calculated so that fat magnetization crosses the zero magnetization line at the beginning of the TSE readout train. Fat crossing the zero magnetization line is also known as "fat nulling". A longer $t_{delay}$ will result in negative fat signal at the beginning of the train, a shorter $t_{delay}$ in positive fat signal. Note that the FSIR is typically a SPAIR pulse, which is an adiabatic pulse. Non-adiabatic pulses could alternatively be used in some embodiments, but an adiabatic inversion is generally preferred. The inversion of the magnetization is shown at the center of the FSIR pulse. That is a simplification and to first order corresponds to a non-adiabatic FSIR, whereas the inversion by an adiabatic FSIR is typically depicted as occurring at its end. It should be noted that where the point of inversion is drawn in FIG. 4 does not affect the function of the fat suppression module. Importantly, the value of the initial fat magnetization (prior to the fat saturation) is irrelevant for the function of the fat suppression module, because the saturation forces fat magnetization to zero regardless of its prior value.

Figure 5:
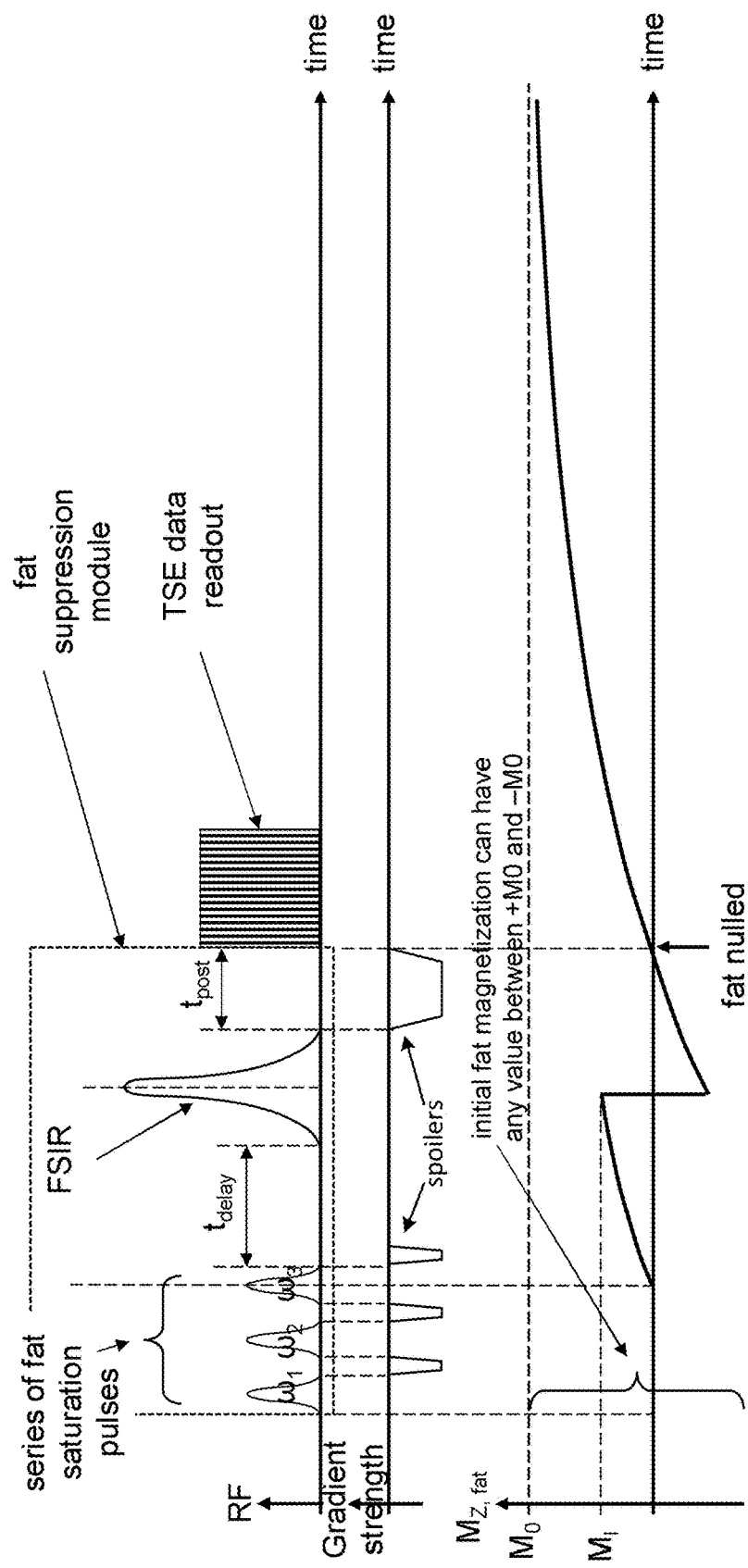
FIG. 5 shows a fat suppression module with consecutive Turbo-Spin Echo (TSE) readout where the fat saturation pulse replaced by series of saturation pulses, according to some embodiments of the present invention.

FIG. 5 shows an embodiment of the fat suppression module where the leading fat saturation comprises three fat saturation pulses played at slightly different frequencies (ω1, ω2, ω3) around the fat frequency (e.g., +/−50 Hz around the fat frequency), using slightly different flip angles (between 90° and 120°) and tipped around different axes (for example +x, −x, +y, −y or any angle axis between these axes). Spoilers are played after each saturation pulse. Spoilers can be played on all gradient axes (x, y, z) and random or pseudo-random spoiler magnitude and signs can be applied. The purpose of this scheme is to improve B0- and B1-robustnes of fat saturation.

Figure 6:
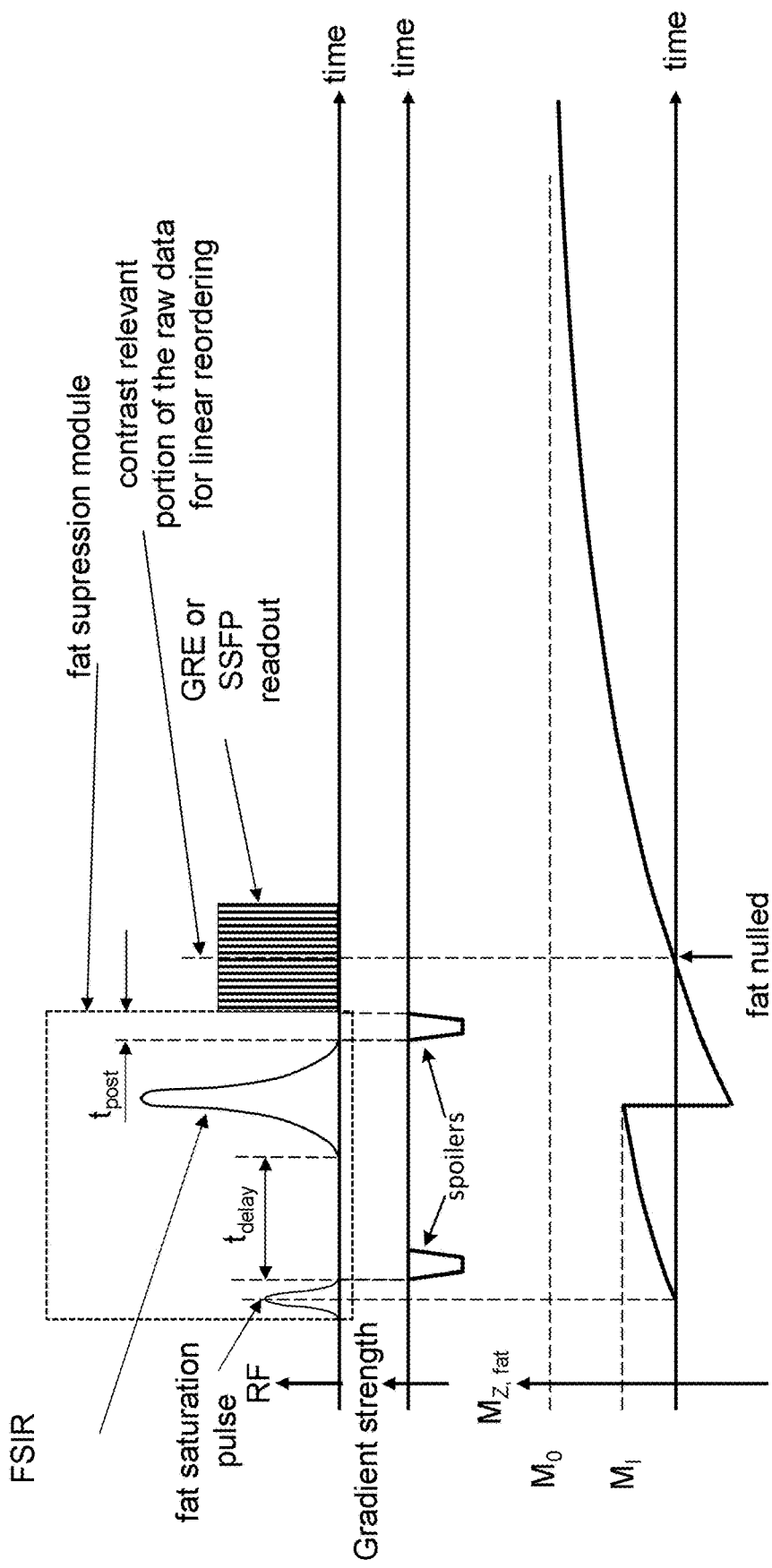
FIG. 6 shows fat suppression module with consecutive Gradient Recalled Echo (GRE) or Steady State Free Precession (SSFP) readout, according to some embodiments of the present invention.

FIG. 6 shows an embodiment of the fat suppression module combined with a gradient recalled echo (GRE) or a steady state free precession (SSFP) readout. For such readout and for linear reordering, the line of data being most important for establishing the image contrast) is in the center of the readout (acquiring the center of the raw data space/k-space which is its contrast relevant portion. In the example of FIG. 6, the center line is the 6th out of 11 acquired lines. This may be contrasted with conventional TSE readout techniques which capture the longitudinal magnetization right at its start. For GRE and SSFP, the time $t_{delay}$ is increased compared to TSE so that fat signal is nulled at the center of the readout rather than at its start, as seen in FIG. 6.

Figure 7:
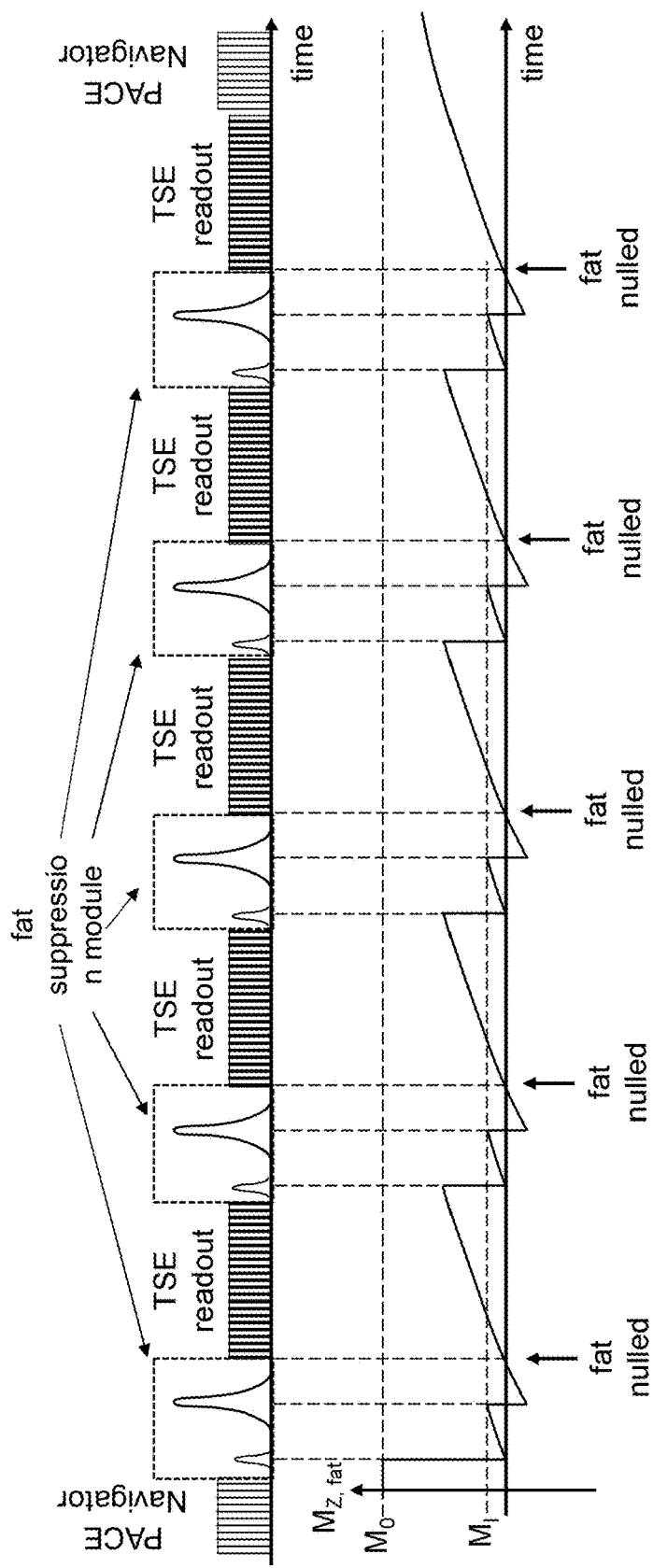
FIG. 7 shows fat suppression modules with five TSE readouts between two respiratory navigator scans, according to some embodiments of the present invention.

FIG. 7 illustrates an example embodiment where a series of fat suppression modules are applied with subsequent TSE readouts. In this example, five TSE readout trains, each preceded by the fat suppression module, are shown; however, it should be understood that the general concept presented in FIG. 7 may be extended to any number of readout train/module combinations. A respiratory navigator scan is executed before and after this series of events. Before the first fat suppression module, fat has full magnetization (M0). Before all other modules, fat magnetization is only a fraction of M0. Regardless, fat steady state is reached with the first module and fat is identically nulled for each readout train.

Figure 8:
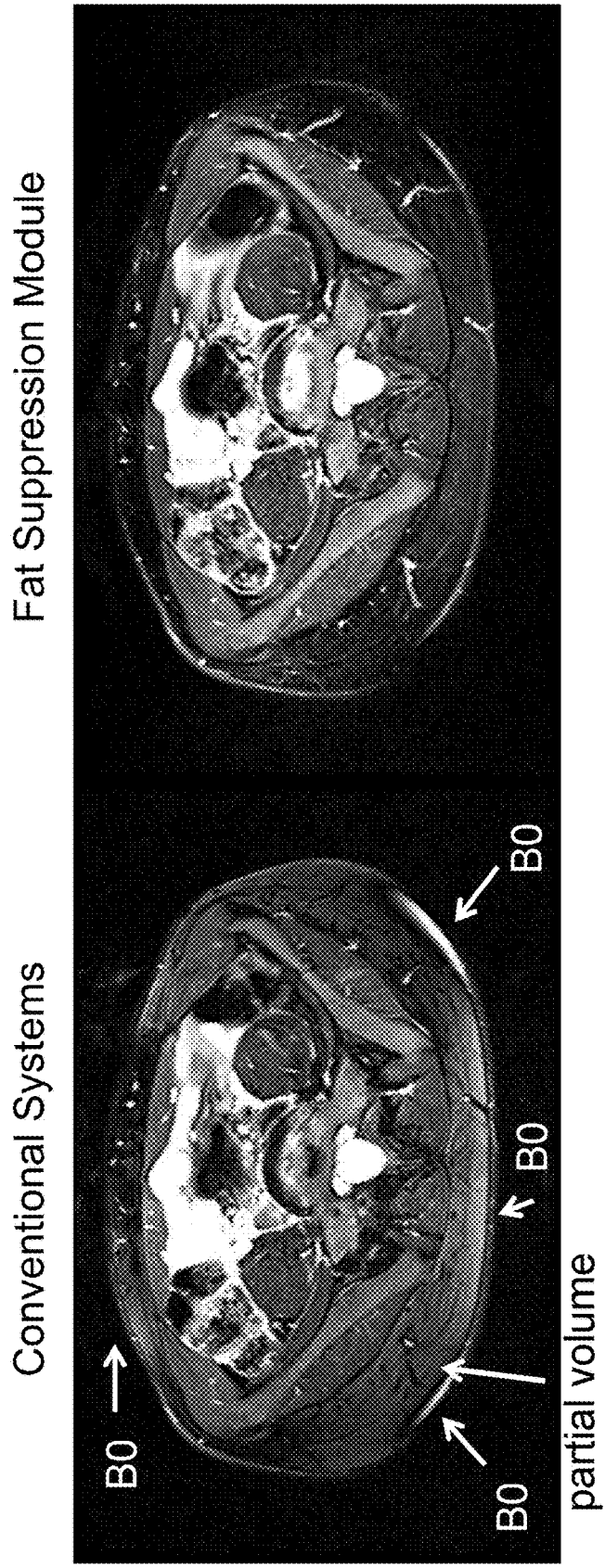
FIG. 8 provides a comparison of conventional acquisition techniques with the fat suppression module as applied to a first volunteer; note the poor fat suppression of the prior art, as denoted by B0, and the improved more homogeneous suppression provided using the techniques described herein.
Figure 9:
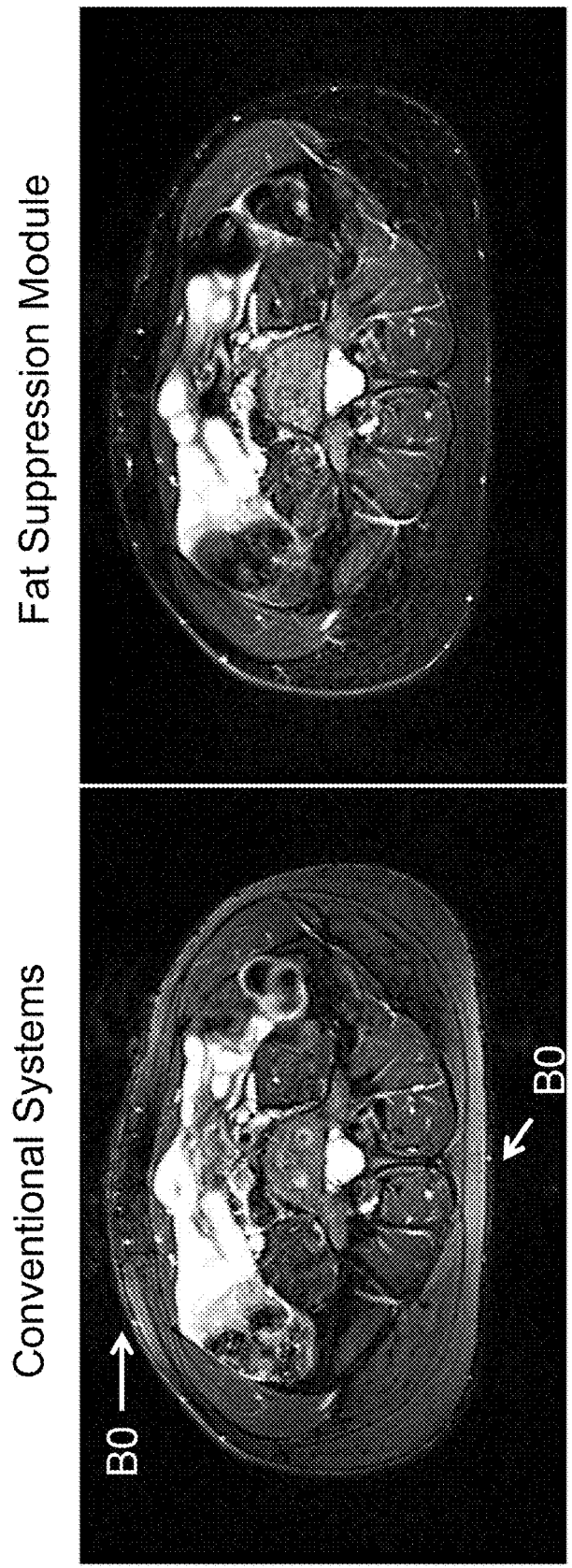
FIG. 9 provides a comparison of conventional acquisition techniques with the fat suppression module as applied to a second volunteer.

FIG. 8 compares an axial image of a volunteer human abdomen acquired with a conventional system (left) with the fat module discussed herein (right). This example illustrates the larger B0 robustness and the on-average darker (better suppressed) subcutaneous and abdominal fat signal. FIG. 9 provides an example of a similar comparison made for a second volunteer, which further highlights the advantages of the fat suppression module.

The fat suppression module discussed herein can be applied to a variety of imaging sequences and scenarios with the following advantages. As described above, it overcomes inhomogeneous fat suppression in cases where the effective TR is so short that fat magnetization is in a locally varying steady state. It is a more robust and immediately effective alternative to the conventional technique of playing SPAIR pulses in a periodic manner. The fat suppression module discussed herein suppresses fat immediately even the first time it is applied, whereas conventional techniques require multiple effective TRs to get to steady state and only suppresses fat effectively once steady state is established. The fat suppression module thereby saves time as no leading data has to be discarded due to lack of fat suppression.

The fat suppression module may also be applied in conjunction with a leading scout sequence, for example a respiratory navigator. Scout sequences usually do not include fat suppression and therefore subsequent imaging sequences that rely on the fat steady state cannot immediately acquire fat-suppressed data. They first have to establish the fat steady state which takes time and causes an unfavorable difference between the assumed respiratory position determined by the scout sequence and the actual respiratory position during the imaging sequence. To avoid such difference in position the imaging sequence typically does not wait for the steady state to be established. As consequence the leading readout data has different fat magnetization levels than the remainder of the data. If the data corresponds to different slices, then fat suppression in the leading slices is poor. By providing complete fat suppression immediately, the fat suppression module eliminates this problem.

The fat suppression module is also useful in case of a varying effective TR. This frequently happens when synchronizing with physiologic signals such as ECG or peripheral pulse (pulse oximetry). At 3 Tesla field strength, T1 of fat is too long to fully recover within one R-R interval after each fat-selective inversion. Fat will thus be suppressed to a different degree after each fat inversion. Fat ghosting will result in segmented images, and fat depiction will vary by slice in multi-slice single-shot images. These problems are solved by the fat suppression module as it suppresses fat magnetization identically across segments and slices avoiding described artifacts or inconsistencies.

Figure 10:
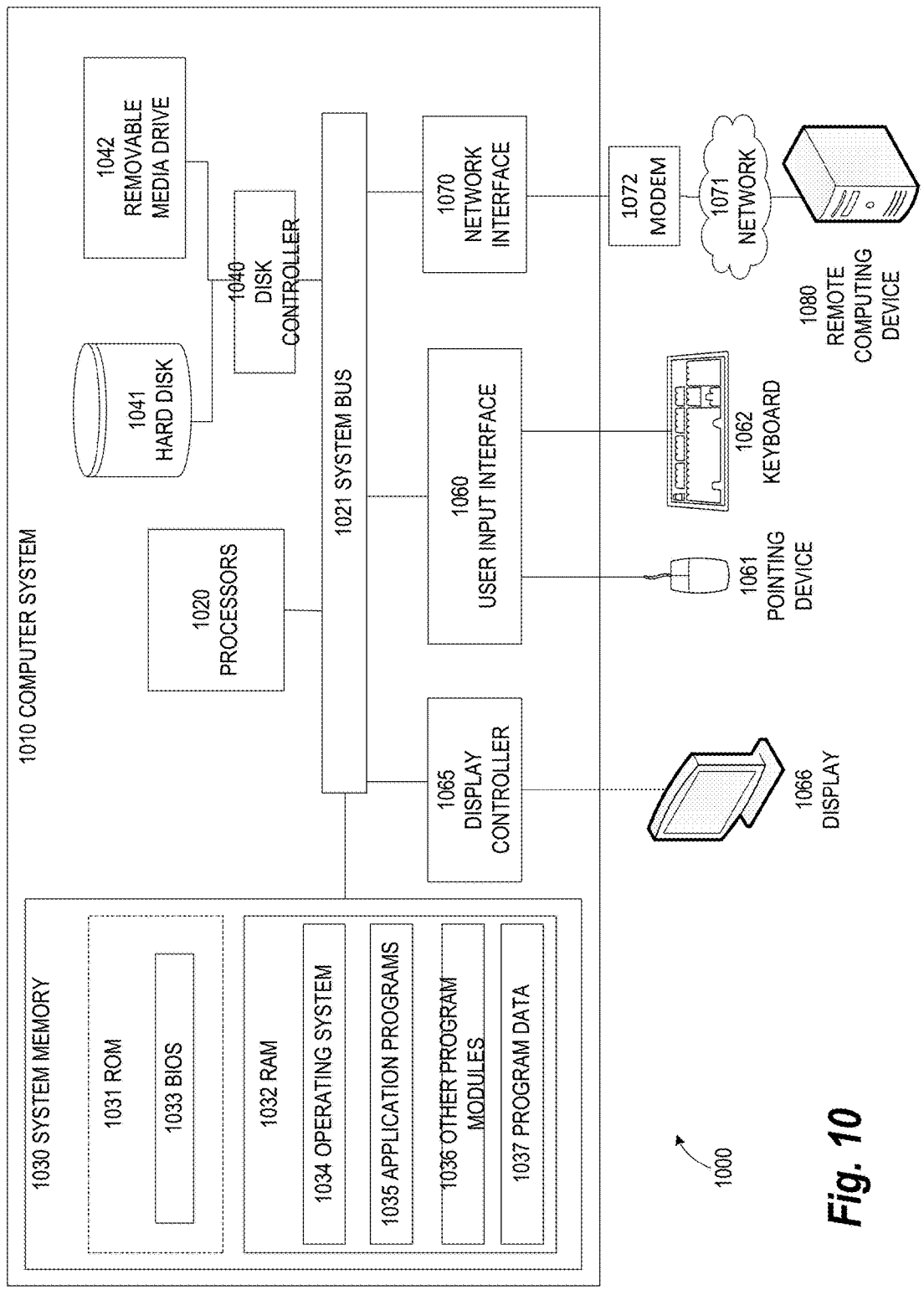
FIG. 10 illustrates an exemplary computing environment within which embodiments of the invention may be implemented.

FIG. 10 illustrates an exemplary computing environment 1000 within which embodiments of the invention may be implemented. For example, this in some embodiments, the computing environment 1000 may be used to implement one or more of the components illustrated in the system 100 of FIG. 3. The computing environment 1000 may include computer system 1010, which is one example of a computing system upon which embodiments of the invention may be implemented. Computers and computing environments, such as computer system 1010 and computing environment 1000, are known to those of skill in the art and thus are described briefly here.

As shown in FIG. 10, the computer system 1010 may include a communication mechanism such as a bus 1021 or other communication mechanism for communicating information within the computer system 1010. The computer system 1010 further includes one or more processors 1020 coupled with the bus 1021 for processing the information. The processors 1020 may include one or more central processing units (CPUs), graphical processing units (GPUs), or any other processor known in the art.

The computer system 1010 also includes a system memory 1030 coupled to the bus 1021 for storing information and instructions to be executed by processors 1020. The system memory 1030 may include computer readable storage media in the form of volatile and/or nonvolatile memory, such as read only memory (ROM) 1031 and/or random access memory (RAM) 1032. The system memory RAM 1032 may include other dynamic storage device(s) (e.g., dynamic RAM, static RAM, and synchronous DRAM). The system memory ROM 1031 may include other static storage device(s) (e.g., programmable ROM, erasable PROM, and electrically erasable PROM). In addition, the system memory 1030 may be used for storing temporary variables or other intermediate information during the execution of instructions by the processors 1020. A basic input/output system (BIOS) 1033 containing the basic routines that help to transfer information between elements within computer system 1010, such as during start-up, may be stored in ROM 1031. RAM 1032 may contain data and/or program modules that are immediately accessible to and/or presently being operated on by the processors 1020. System memory 1030 may additionally include, for example, operating system 1034, application programs 1035, other program modules 1036 and program data 1037.

The computer system 1010 also includes a disk controller 1040 coupled to the bus 1021 to control one or more storage devices for storing information and instructions, such as a hard disk 1041 and a removable media drive 1042 (e.g., floppy disk drive, compact disc drive, tape drive, and/or solid state drive). The storage devices may be added to the computer system 1010 using an appropriate device interface (e.g., a small computer system interface (SCSI), integrated device electronics (IDE), Universal Serial Bus (USB), or FireWire).

The computer system 1010 may also include a display controller 1065 coupled to the bus 1021 to control a display 1066, such as a cathode ray tube (CRT) or liquid crystal display (LCD), for displaying information to a computer user. The computer system includes an input interface 1060 and one or more input devices, such as a keyboard 1062 and a pointing device 1061, for interacting with a computer user and providing information to the processor 1020. The pointing device 1061, for example, may be a mouse, a trackball, or a pointing stick for communicating direction information and command selections to the processor 1020 and for controlling cursor movement on the display 1066. The display 1066 may provide a touch screen interface which allows input to supplement or replace the communication of direction information and command selections by the pointing device 1061.

The computer system 1010 may perform a portion or all of the processing steps of embodiments of the invention in response to the processors 1020 executing one or more sequences of one or more instructions contained in a memory, such as the system memory 1030. Such instructions may be read into the system memory 1030 from another computer readable medium, such as a hard disk 1041 or a removable media drive 1042. The hard disk 1041 may contain one or more datastores and data files used by embodiments of the present invention. Datastore contents and data files may be encrypted to improve security. The processors 1020 may also be employed in a multi-processing arrangement to execute the one or more sequences of instructions contained in system memory 1030. In alternative embodiments, hard-wired circuitry may be used in place of or in combination with software instructions. Thus, embodiments are not limited to any specific combination of hardware circuitry and software.

As stated above, the computer system 1010 may include at least one computer readable medium or memory for holding instructions programmed according to embodiments of the invention and for containing data structures, tables, records, or other data described herein. The term "computer readable medium" as used herein refers to any medium that participates in providing instructions to the processor 1020 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 1041 or removable media drive 1042. Non-limiting examples of volatile media include dynamic memory, such as system memory 1030. Non-limiting examples of transmission media include coaxial cables, copper wire, and fiber optics, including the wires that make up the bus 1021. Transmission media may also take the form of acoustic or light waves, such as those generated during radio wave and infrared data communications.

The computing environment 1000 may further include the computer system 1010 operating in a networked environment using logical connections to one or more remote computers, such as remote computer 1080. Remote computer 1080 may be a personal computer (laptop or desktop), a mobile device, a server, a router, a network PC, a peer device or other common network node, and typically includes many or all of the elements described above relative to computer system 1010. When used in a networking environment, computer system 1010 may include modem 1072 for establishing communications over a network 1071, such as the Internet. Modem 1072 may be connected to bus 1021 via user network interface 1070, or via another appropriate mechanism.

Network 1071 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 1010 and other computers (e.g., remote computer 1080). The network 1071 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 1071.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

I claim:

1. A method of fat suppression during magnetic resonance imaging, the method comprising:
   applying a fat suppression module to a region of interest within a subject, the fat suppression module comprising:
      a fat-selective saturation pulse;
      a first spoiler gradient applied following the fat-selective saturation pulse;
      a fat-selective inversion pulse applied to the region of interest following a time delay, wherein the time delay is selected to allow T1 recovery in the region of interest to a predetermined level of fat magnetization at the end of the time delay;
      a second spoiler gradient applied following the fat-selective inversion pulse;
   following application of the fat suppression module, performing a sequence readout to acquire one or more lines of k-space data covering the region of interest.

2. The method of claim 1, wherein the fat-selective inversion pulse is an adiabatic pulse.

3. The method of claim 1, wherein the fat-selective saturation pulse is adiabatic.

4. The method of claim 1, wherein the sequence readout comprises a turbo-spin echo readout train and the time delay is selected such that fat magnetization in the region of interest is substantially zero at the beginning of the turbo-spin echo readout train.

5. The method of claim 1, wherein the time delay is selected such that fat magnetization is a predetermined value when the sequence readout acquires a contrast-relevant portion of k-space.

6. The method of claim 5, wherein the predetermined value is zero.

7. The method of claim 1, wherein the amplitude and sign of the first spoiler gradient is determined by a random or pseudo-random scheme.

8. The method of claim 7, wherein the amplitude and sign of the second spoiler gradient is determined by the random or pseudo-random scheme.

9. A method of fat suppression during magnetic resonance imaging, the method comprising:
   applying a fat suppression module to a region of interest within a subject, the fat suppression module comprising:
      a series of fat-selective saturation pulses, wherein a first spoiler gradient is applied to the region of interest following each fat-selective saturation pulse;
      a time delay starting and the end of the series of fat-selective saturation pulses, wherein the time delay is selected to allow T1 recovery in the region of interest to a predetermined level of fat magnetization at the end of the time delay;
      a fat-selective inversion pulse applied to the region of interest following the time delay; and
      a second spoiler gradient applied following the fat-selective inversion pulse;
   following application of the fat suppression module, acquiring one or more lines of k-space data covering the region of interest.

10. The method of claim 9, wherein the series of fat-selective saturation pulses is applied at different frequencies within 100 Hz of a fat frequency.

11. The method of claim 9, wherein the series of fat-selective saturation pulses each have a different flip angle between 90° and 180°.

12. The method of claim 9, wherein the series of fat-selective saturation pulses are each rotated around a different axis.

13. The method of claim 9, wherein the sequence readout comprises a turbo-spin echo readout train and the time delay is selected such that fat magnetization in the region of interest is substantially zero at the beginning of the turbo-spin echo readout train.

14. The method of claim 11, wherein the time delay is selected such that fat magnetization is a predetermined value when the sequence readout acquires a contrast-relevant portion of k-space.

15. The method of claim 14, wherein the predetermined value is zero.

16. A system for fat suppression during magnetic resonance imaging, the system comprising:
   an imaging device comprising a plurality of coils;
   one or more processors; and
   a non-transitory, computer-readable storage medium in operable communication with the processor, wherein the computer-readable storage medium contains one or more programming instructions that, when executed, cause the processors to:
      apply a fat suppression module to a region of interest within a subject using the coils, the fat suppression module comprising:
         one or more fat-selective saturation pulses;
         a first spoiler gradient applied following each fat-selective saturation pulse;
         a fat-selective inversion pulse applied to the region of interest following a time delay, wherein the time delay is selected to allow T1 recovery in the region of interest to a predetermined level of fat magnetization at the end of the time delay;
         a second spoiler gradient applied following the fat-selective inversion pulse;
      following application of the fat suppression module, use the plurality of coils to acquire one or more lines of k-space data covering the region of interest.

17. The system of claim 16, wherein the fat-selective inversion pulse is an adiabatic pulse.

18. The system of claim 16, wherein the fat-selective saturation pulse is adiabatic.

19. The system of claim 16, wherein the one or more lines of k-space data are acquired using a turbo-spin echo readout train and the time delay is selected such that fat magnetization in the region of interest is substantially zero at the beginning of the turbo-spin echo readout train.

20. The system of claim 16, wherein the time delay is selected such that fat magnetization is a predetermined value when the sequence readout acquires a contrast-relevant portion of k-space.

* * * * *